US011469057B2

(12) United States Patent
Wang et al.

(10) Patent No.: US 11,469,057 B2
(45) Date of Patent: Oct. 11, 2022

(54) ADJUSTABLE CONTACTOR

(71) Applicant: Schneider Electric Industries SAS, Rueil-Malmaison (FR)

(72) Inventors: Yuanzhong Wang, Shanghai (CN); Yixu Wang, Shanghai (CN); Francois Chaudot, Mendès (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 154 days.

(21) Appl. No.: 16/733,481

(22) Filed: Jan. 3, 2020

(65) Prior Publication Data

US 2020/0144001 A1 May 7, 2020

Related U.S. Application Data

(63) Continuation-in-part of application No. 15/392,780, filed on Dec. 28, 2016, now abandoned.

(30) Foreign Application Priority Data

Dec. 30, 2015 (CN) .......................... 201521131998.5

(51) Int. Cl.
*H01H 1/34* (2006.01)
*H01H 1/24* (2006.01)
(Continued)

(52) U.S. Cl.
CPC ............. *H01H 1/34* (2013.01); *G01R 31/327* (2013.01); *G01R 31/3274* (2013.01);
(Continued)

(58) Field of Classification Search
None
See application file for complete search history.

(56) References Cited

U.S. PATENT DOCUMENTS 1,003,634 A 9/1911 McIntyre
3,226,521 A * 12/1965 Motegi ................... H01H 1/50
200/257

(Continued)

FOREIGN PATENT DOCUMENTS

DE 1690427 7/1971
GB 1587633 4/1981
(Continued)

OTHER PUBLICATIONS

English Language Machine Translation of Japanese Patent Application Publication No. JPH07242882, published on Sep. 19, 1995, 27 pages.

(Continued)

*Primary Examiner* — Felix O Figueroa
(74) *Attorney, Agent, or Firm* — Locke Lord LLP

(57) ABSTRACT

The present utility model discloses an adjustable contactor including: a static contact fixed in the contactor; a movable contact which is connected in the movable contact bracket through a contact spring, and which makes contact with the static contact in accordance with the movement of the movable contact bracket in the contactor; the contactor further includes adjusting knobs provided in the movable contact bracket at one end in connection with the contact spring while corresponding to the contact springs connected with individual movable contacts, the adjusting knob being set so that adjustment of the compression or release of the contact spring is achieved by rotating the adjusting knob so as to adjust the contact pressure of the movable contact.

17 Claims, 4 Drawing Sheets

--- pre-assembling the contactor so that the movable contact contacts the static contact, measuring an overtravel of each contact spring and a bounce time of each movable contact, operating the adjusting knob so as to adjust a contact pressure of the contact spring, based on a measured value of the overtravel of each contact spring and a measured value of the bounce time of each movable contact.

(51) Int. Cl.
  *H01H 3/38* (2006.01)
  *G01R 31/327* (2006.01)
  *H01H 11/00* (2006.01)

(52) U.S. Cl.
  CPC ............... *H01H 1/24* (2013.01); *H01H 3/38* (2013.01); *H01H 11/0062* (2013.01); *H01H 2207/026* (2013.01); *H01H 2235/00* (2013.01)

(56) References Cited

U.S. PATENT DOCUMENTS

| | | | | |
|---|---|---|---|---|
| 3,235,699 | A | * 2/1966 | Brumfield | H01H 1/226 200/251 |
| 4,159,161 | A | * 6/1979 | Timmer | H01R 11/26 269/284 |
| 4,635,014 | A | 1/1987 | Erb et al. | |
| 5,023,581 | A | * 6/1991 | Sugiyama | H01H 1/34 335/126 |
| 5,434,566 | A | * 7/1995 | Iwasa | H01H 13/84 400/481 |
| 5,461,326 | A | * 10/1995 | Woith | G01R 1/0735 324/750.25 |

FOREIGN PATENT DOCUMENTS

| | | |
|---|---|---|
| GB | 2150761 A | 7/1985 |
| JP | 56-112834 | 1/1981 |
| JP | 57-21030 | 2/1982 |
| JP | H07242882 | 9/1995 |
| JP | 2000-214203 | 8/2000 |

OTHER PUBLICATIONS

Japanese Office Action for Japanese Patent Application No. 2016-255583 dated May 8, 2018, 3 pages.
English Language Translation of Japanese Office Action for Japanese Patent Application No. 2016-255583 dated May 8, 2018, 3 pages.
English Language Translation of the Abstract only for Japanese Patent Publication No. JP56-112834, published on Jan. 31, 1981, 1 page.
English Language Translation of the Abstract only for Japanese Patent Publication No. JP5721030, published on Feb. 3, 1982, 1 page.
English Language Machine Translation of Japanese Patent Publication No. JP2000-214203, published Aug. 4, 2000, 4 pages.
Japanese Office Action for JP Patent Application No. 2016-255583, dated Dec. 26, 2017, 5 pages.
English Language Translation of Japanese Office Action for JP Patent Application No. 2016-255583, dated Dec. 26, 2017, 4 pages.
English Language Machine Translation of German Patent Publication No. DE1690427A1, published on Jul. 15, 1971, 3 pages.

* cited by examiner

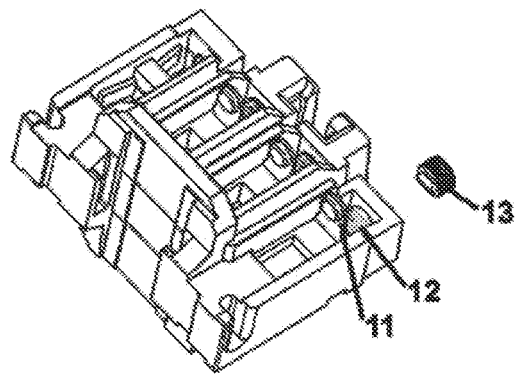

Fig. 4

| pre-assembling the contactor so that the movable contact contacts the static contact, |
|---|

| measuring an overtravel of each contact spring and a bounce time of each movable contact, |
|---|

| operating the adjusting knob so as to adjust a contact pressure of the contact spring, based on a measured value of the overtravel of each contact spring and a measured value of the bounce time of each movable contact. |
|---|

Fig. 5 pre-assembling the contactor so that the movable contact contacts the static contact,

moving the movable contact bracket toward the static contact so that the contact spring between the movable contact and the movable contact bracket is compressed to have the overtravel and to establish the contact pressure reacting upon the movable contact,

measuring an overtravel of each contact spring and a bounce time of each movable contact,

operating the adjusting knob so as to adjust a contact pressure of the contact spring, based on a measured value of the overtravel of each contact spring and a measured value of the bounce time of each movable contact.

Fig. 6 pre-assembling the contactor so that the movable contact contacts the static contact,

moving the movable contact bracket toward the static contact so that the contact spring between the movable contact and the movable contact bracket is compressed to have the overtravel and to establish the contact pressure reacting upon the movable contact,

measuring an overtravel of each contact spring and a bounce time of each movable contact,

rotating the adjusting knob to adjust compression or release of the contact spring so as to adjust a contact pressure of the movable contact, wherein the contact pressure of the movable contact is a pressure at which the movable contact contacts the static contact.

Fig. 7 pre-assembling the contactor so that the movable contact contacts the static contact,

moving the movable contact bracket toward the static contact so that the contact spring between the movable contact and the movable contact bracket is compressed to have the overtravel and to establish the contact pressure reacting upon the movable contact,

measuring an overtravel of each contact spring and a bounce time of each movable contact,

rotating the adjusting knob to adjust compression or release of the contact spring so as to adjust a contact pressure of the movable contact, wherein the contact pressure of the movable contact is a pressure at which the movable contact contacts the static contact,

re-measuring the bounce time of each movable contact after completion of the operating the adjusting knob,

testing a pull-in voltage threshold and a release voltage threshold of the contactor.

Fig. 8 enabling the movable contact to contact the static contact by a detector, the movable contact corresponds to the contact spring and then releases the contact spring that the movable contact corresponds to, so as to obtain the bounce time and the contact pressure of the movable contact,

analyzing the bounce time of the movable contact.

Fig. 9

ADJUSTABLE CONTACTOR

This application is a continuation-in-part of, and claims priority under 35 U.S.C. § 120 to, co-pending U.S. patent application Ser. No. 15/392,780, filed on Dec. 28, 2016, which claims priority under 35 U.S.C. § 119 to Chinese Patent Application No. ZL201521131998.5, filed on Dec. 30, 2015, which applications are incorporated by reference herein in their entirety.

BACKGROUND

The present utility model relates to an adjustable contactor.

In a conventional contactor, a circuit is closed by bringing the movable contact and the static contact into contact. However, the contact pressure between the movable contact and the static contact is critical to the electrical shock stability. To ensure a good contact, it is necessary to ensure a considerable contact pressure. In general, a certain overtravel is required in the design of the movable contact and the static contact, which means the compression stroke of the contact spring after the contact of the movable contact with the static contact. The overtravel can ensure that a certain contact pressure can still be kept for the contact even after its electrical wear, and due to the cushioning made by the contact spring force, the bounce is depressed, and a certain initial kinetic energy can be obtained by the contact when the contact is opened.

If the overtravel is too small, it can not guarantee the contact pressure necessary for the contact after its electrical wear, and at the same time, the initial opening velocity becomes smaller, which would affect the open/close of the contactor and its dynamic thermal stability. But when the overtravel is too large, the switching-on power of the operating mechanism would be increased, such that the switching-on will be very unreliable. Setting a suitable overtravel can provide the contactor with a proper contact pressure, thus ensuring a good contact.

Thus, the overtravel setting is critical to the performance of the contactor.

SUMMARY

In actual products, there is an inconsistency in overtravel and contact pressure among the electrodes of the contactor, and the contact force at each of the electrodes is unbalanced and has a greatly wide range. In view of the above problems, the present utility model has developed a new type of adjustable contactor to adjust the contact pressure at each of the electrodes (movable contacts), such that an optimal contact force between the contacts is obtained, thereby reducing the bounce and increasing the electrical stability.

One embodiment according to the present utility model discloses a type of adjustable contactor, which comprises: a static contact fixed in the contactor; a movable contact which is connected in the movable contact bracket through a contact spring, and which makes contact with the static contact in accordance with the translational motion of the movable contact bracket in the contactor; the contactor further comprises adjusting knobs provided in the movable contact bracket at one end in connection with the contact spring while corresponding to the contact springs connected with individual movable contacts, the adjusting knob being set so that adjustment of the compression or release of the contact spring is achieved by rotating the adjusting knob so as to adjust the contact pressure of the movable contact, and the contact pressure of the movable contact is a pressure at which the movable contact contacts the static contact.

The movable contact bracket has several movable contacts.

The overtravel of each contact spring and the bounce time of each movable contact is measured upon the pre-assembled contactor, and, the adjusting knob is operated so as to adjust the contact pressure of the contact spring, based on the measured overtravel value of each contact spring and the bounce time value of each movable contact.

The bounce time of each movable contact is re-measured after the completion of the operating the adjusting knob.

After the completion of re-measurement of the bounce time of each movable contact, the pull-in voltage threshold and the release voltage threshold of the contactor are tested.

The adjusting knob is connected to the contact spring by means of a helical structure.

The contactor of the present utility model has the following advantages:

A good contact between the movable contact and the static contact is achieved;

The inconsistency between the electrodes is eliminated, and the contact pressure at each of the electrodes is compensated so as to obtain a more balanced and stable connection;

The bounce occurred during the opening and closing of current is depressed, thus improving the electrical stability;

Depressing compact upon the movable contact, the static contact and the magnetic pole, thus improving the mechanical durability;

It is possible to increase the initial speed during power failure, thus improve the electrical stability performance.

BRIEF DESCRIPTION OF THE DRAWINGS

The above and/or other aspects and advantages of the present invention will become more apparent and more readily appreciated from the following detailed description taken in conjunction with the accompanying drawings in which:

FIGS. 3 and 4 are schematic views showing the structure of the adjusting knob in a contactor according to the present utility model.

FIGS. 5-8 are flow charts of methods of assembling a contactor according to embodiments of the present disclosure.

FIG. 9 is a flow chart of a method of pre-assembling contactor according to an embodiment of the present disclosure.

DETAILED DESCRIPTION

By incorporating an adjusting knob structure in the movable contact, the present utility model thereby achieves an adjustment of the contact pressure to overcame the problem that various electrodes of a contactor tend to differ from each other in overtravel and contact pressure thereof.

A brief description of the structure of a contactor will be made in conjunction with FIGS. 1-4 in the following.

Figure 1:
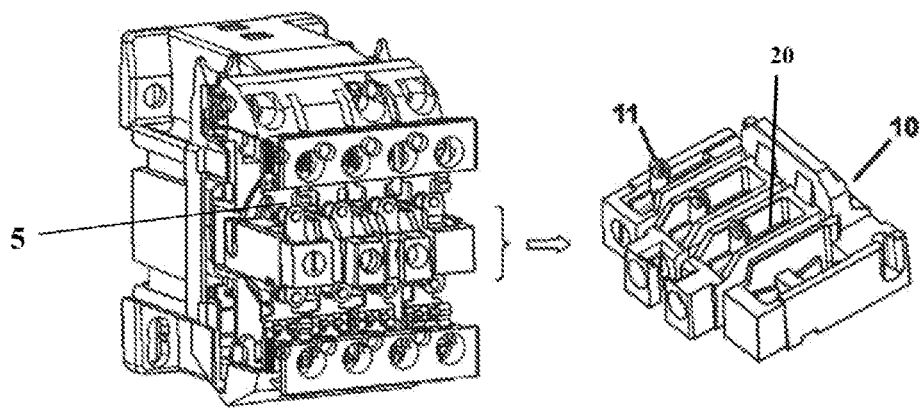
FIG. 1 is a schematic structural view of a contactor according to the present utility model.

Referring to FIG. 1, the movable contact 11 of the contactor makes a contact with the static contact 5 fixed in the contactor by means of the translational motion of the movable contact bracket 10 within the contactor.

Figure 2:
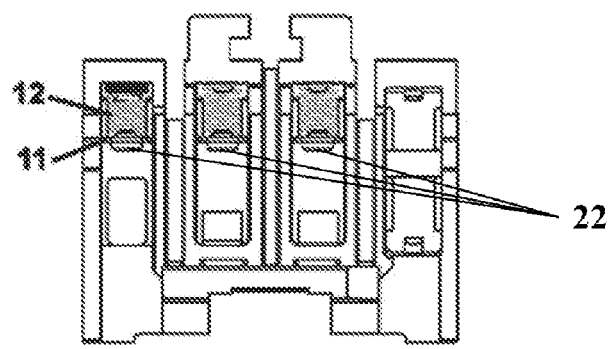
FIG. 2 is a top view of the movable contact structure in a contactor according to the present utility model.

Referring to FIG. 2, in the movable contact bracket 10, the movable contact 11 corresponding to each of the electrodes is connected to the movable contact bracket 10 through the contact spring 12. The movable contact 11 moves close to or away from the static contact 5 of the contactor with the translational motion of the movable contact bracket 10. After the movable contact 11 is brought into contact with the static contact, along with further translational motion of the movable contact bracket 10 toward the static contact, the contact spring 12 located between the movable contact 11 and the movable contact bracket is compressed, thus establishing a contact pressure reacting upon the movable contact 11.

Figure 3:
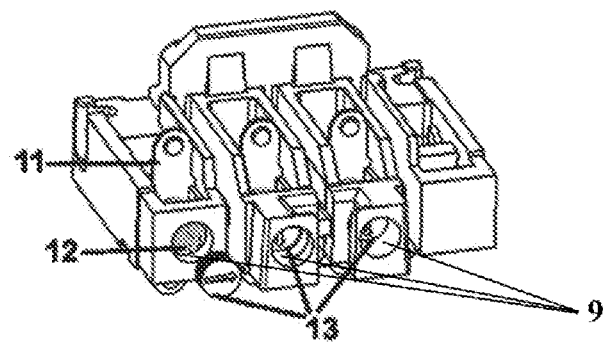

Referring to FIGS. 3 and 4, the contactor according to the present utility model adds an adjusting knob 13 for each of the electrodes. The adjusting knob 13 is arranged at the end where the movable contact bracket is connected with the contact spring 12, so that, by rotating the adjusting knob 13, the contact spring 12 varies in its length and thus an adjustment of the compression or release of the contact spring 12 can be achieved, thereby achieving an adjustment of the contact pressure applied to the movable contact 11. For example, the movable contact bracket 10 includes grooves 20 spaced apart from each other, each groove 20 is provided with one contact spring 12 and one movable contact 11, the movable contact 11 has an end 22 beyond the groove 20 (referring to the upper end of the movable contact 11 in FIG. 3), and an orthographic projection that the entire end 22 beyond the groove 20 has on the movable contact bracket 10 is within a region where the groove 20 is located (that is, in a ranking direction of the grooves 20, the movable contact 11 does not exceed the groove 20). The adjusting knob 13 is connected to the movable contact bracket 10 by means of a helical structure 9 for example, and then is connected to the contact spring 12, thereby achieving an adjustment of the compression or release of the contact spring 12. Here, the adjusting knob 13 can also be installed in other ways know in this art, so as to achieve an adjustment of the compression or release of the contact spring 12. By making adjustment to the adjusting knob 13 of different electrodes respectively (that is, the contact pressures of the movable contacts are not adjusted at the same time, namely the contact pressures of the contact springs are adjusted asynchronous) according to the actual conditions of the contact pressure of the contact spring in distinct electrodes, it is possible to achieve the consistency of the contact pressure among different electrodes (that is, to achieve that values of the contact pressures of the movable contacts are same), and thus obtaining an improved stability about the close/open of the current.

In actual practice, as shown in FIGS. 5-8, step one is firstly performed, i.e., pre-assembling the contactor. In a conventional operation, after the contactor is pre-assembled (pre-assembling is a process of realizing a pre-assembled contactor in which a state between the movable contact and the static contact is switchable between a contact state and a non-contact state, before adjustment of the contact pressures of the movable contacts), a test will be made to the pull-in voltage threshold and the release voltage threshold, and finally, the contactor will be subjected to fastening and integration. For example, the pre-assembling includes: moving the movable contact bracket in the contactor so that the movable contact moves close to the static contact and then contacts the static contact (so as to realize the contact state). For example, the pre-assembling further includes: after the movable contact contacts the static contact, moving the movable contact bracket toward the static contact so that the contact spring between the movable contact and the movable contact bracket is compressed to have the overtravel and to establish the contact pressure reacting upon the movable contact. For example, the pre-assembling further includes: releasing the contact spring so that the movable contact does not contact the static contact (so as to realize the non-contact state). For the contactor according to the present utility model added with an adjusting knob 13 for adjusting the contact pressure, it is required to add the following steps after the pre-assembling. Step two: measuring the overtravel of each of the contact springs to determine the contact pressure of the movable contact, thereby determining the contact pressure of each movable contact (for example, the contact pressure of the movable contact is equal to the contact pressure of the contact spring); step three: measuring the bounce time of each of the movable contacts; step four: based on the overtravel value (value of the overtravel) of each contact spring and the bounce time value (value of the bounce time) of each movable contact measured in steps two and three, operating the adjusting knob 13 to adjust the contact pressure of the contact spring 12, thereby achieving the consistency among the contact springs 12 of various electrodes (namely achieving that the contact pressures of the contact springs have a same value); step five: after the completion of operating the adjusting knob, re-measuring the bounce time of each movable contact so as to obtain consistency among various contact springs. After the completion of the above related operation upon the contact pressure, a conventional operation step is performed, i.e., step six: testing the pull-in voltage threshold and the release voltage threshold, and finally fastening and integrating the contactor so as to obtain an assembled-contactor (a final contactor).

For example, in at least one embodiment, the pre-assembled contactor can be adjusted industrially to replace manual adjustment. For example, industrialization adjustment includes the following two steps. As shown in FIG. 9, First step: by means of a detector (for example, a sensor such as a force and displacement sensor), allowing the movable contact to contact the static contact that the movable contact corresponds to and then releasing the contact spring that the movable contact corresponds to, so as to obtain the bounce time and the contact pressure of the movable contact. Second step: by means of the detector, analyzing the bounce time of the movable contact. In the second step, in presence of the bounce time of the movable contact being greater than a design value, the detector controls the adjusting knob corresponding to the movable contact to rotate, and the contact pressure of the movable contact is adjusted by the detector according to rotation amount of the helical structure of the adjusting knob and a coefficient k of the contact spring. For example, the first step is repeated so that the bounce time and the contact pressure of each movable contact are obtained. For example, the second step is repeated until the bounce time and the contact pressure of each movable contact meet the requirements of the final contactor. By means of the industrialization adjustment, both the bounce time and the contact force are controlled, which ensures the minimum bounce time and the best contact pressure, so that the final contactor has a good and reliable electrical life performance.

By adding an adjusting knob structure in the movable contact, the contactor according to the present utility model, merely through simple operations, achieves adjustment of the contact pressure of various electrodes, obtains an optimal contact force between the contacts, overcomes the problem that various electrodes in a contactor tend to be differ from each other in their overtravel and contact pressure, thereby improving the stability, electrical performance and lifespan of the contactor.

In other embodiments, the contact springs include at least two contact springs which have different contact pressures (in this case, the at least two contact springs have different values of overtravel), and thus at least two movable contacts have different contact pressures. In this way, the contactor (the final contactor) may be used in different application situations. For example, a first movable contact among the at least two movable contacts has a first contact pressure, a second movable contact among the at least two movable contacts has a second contact pressure greater than the first contact pressure, and thus the single contactor may be used in both an application situation requiring a lower contact pressure and another application situation requiring a larger contact pressure.

In the above, description has been made to the configuration, advantages and characteristics of the present utility model through specific embodiments. It is to be understood by those skilled in the art that the foregoing description is by way of example only but by no means to be limiting. Those skilled in the art could make various equivalent changes and substitutions without departing from the spirit and essential characteristics of the present utility model.

What is claimed is:

1. A method of assembling an adjustable contactor, wherein
the contactor comprises static contacts, movable contacts, contact springs and a movable contact bracket; the static contact is fixed in the contactor; the movable contact is connected in the movable contact bracket through the contact spring, and makes contact with the static contact in accordance with the movement of the movable contact bracket in the contactor;
the contactor further comprises adjusting knobs provided in the movable contact bracket at one end in connection with the contact spring while corresponding to the contact springs connected with individual movable contacts, and the adjusting knob is set so that adjustment of compression or release of the contact spring is achieved by rotating the adjusting knob so as to adjust a contact pressure of the movable contact;
the method of assembling comprises:
measuring an overtravel value of each contact spring and a bounce time value of each movable contact after pre-assembling of the contactor, and
operating the adjusting knob so as to adjust a contact pressure of the contact spring, based on a measured value of the overtravel of each contact spring and a measured value of the bounce time of each movable contact to achieve the consistency among the contact springs of various electrodes;
after the completion of operating the adjusting knob, re-measuring the bounce time value of each movable contact so as to obtain consistency among various contact springs; and
testing the pull-in voltage threshold and the release voltage threshold, and fastening and integrating the contactor so as to obtain an assembled-contactor;
before the measuring the overtravel value of each contact spring and the bounce time value of each movable contact, pre-assembling the contactor to allow the movable contact to contact the static contact by a detector, wherein the movable contact corresponds to the contact spring;
releasing the contact spring that the movable contact corresponds to, so as to obtain the bounce time value and the contact pressure of the movable contact; and
analyzing the bounce time of the movable contact by the detector, wherein, if the bounce time of the movable contact is greater than a design value, the detector controls the adjusting knob corresponding to the movable contact to rotate, and the contact pressure of the movable contact is adjusted by the detector according to rotation amount of the helical structure of the adjusting knob and a coefficient k of the contact spring.

2. A method of assembling a contactor, wherein
the contactor comprises static contacts, movable contacts, contact springs and a movable contact bracket, the static contacts are fixed in the contactor, and each movable contact is in the movable contact bracket and is connected with an end of one of the contact springs;
the contactor further comprises adjusting knobs provided in the movable contact bracket, the adjusting knobs correspond to the contact springs respectively, and each adjusting knob connects another end of the contact spring that the adjusting knob corresponds to;
the method of assembling comprises:
measuring an overtravel value of each contact spring and a bounce time value of each movable contact, and
operating the adjusting knob so as to adjust a contact pressure of the contact spring, based on a measured value of the overtravel of each contact spring and a measured value of the bounce time of each movable contact, to achieve the consistency among the contact springs of various electrodes;
after the completion of operating the adjusting knob, re-measuring the bounce time value of each movable contact so as to obtain consistency among various contact springs; and
testing the pull-in voltage threshold and the release voltage threshold, and fastening and integrating the contactor so as to obtain an assembled-contactor;
before the measuring the overtravel value of each contact spring and the bounce time value of each movable contact, pre-assembling the contactor to allow the movable contact to contact the static contact by a detector, wherein the movable contact corresponds to the contact spring;
releasing the contact spring that the movable contact corresponds to, so as to obtain the bounce time value and the contact pressure of the movable contact and
analyzing the bounce time of the movable contact by the detector, wherein, if the bounce time of the movable contact is greater than a design value, the detector controls the adjusting knob corresponding to the movable contact to rotate, and the contact pressure of the movable contact is adjusted by the detector according to rotation amount of the helical structure of the adjusting knob and a coefficient k of the contact spring.

3. The method according to claim 2, wherein the pre-assembling the contactor comprises:
moving the movable contact bracket in the contactor so that the movable contact moves close to the static contact and then contacts the static contact.

4. The method according to claim 3, wherein the pre-assembling the contactor further comprises:
after the movable contact contacts the static contact, moving the movable contact bracket toward the static contact so that the contact spring between the movable contact and the movable contact bracket is compressed to have the overtravel and to establish the contact pressure reacting upon the movable contact.

5. The method according to claim 2, wherein the operating the adjusting knob so as to adjust the contact pressure of the contact spring comprises:

rotating the adjusting knob to adjust compression or release of the contact spring so as to adjust a contact pressure of the movable contact, wherein the contact pressure of the movable contact is a pressure at which the movable contact contacts the static contact.

6. The method according to claim 5, wherein the contact pressure of the movable contact is determined according to the measured value of the overtravel of the contact spring.

7. The method according to claim 5, wherein the contact pressure of the movable contact is equal to the contact pressure of the contact spring.

8. The method according to claim 5, wherein values of the contact pressures of the movable contacts are same.

9. The method according to claim 2, further comprising: re-measuring the bounce time of each movable contact after completion of the operating the adjusting knob.

10. The method according to claim 9, further comprising: after completion of re-measurement of the bounce time value of each movable contact, testing a pull-in voltage threshold and a release voltage threshold of the contactor.

11. The method according to claim 2, wherein the adjusting knob is connected to the contact spring by means of a helical structure.

12. The method according to claim 2, wherein the contact pressures of the contact springs have a same value.

13. The method according to claim 2, wherein the contact springs comprise at least two contact springs which have different contact pressures.

14. The method according to claim 13, wherein the at least two contact springs have different values of overtravel.

15. The method according to claim 2, wherein the contact pressures of the contact springs are adjusted asynchronous.

16. The method according to claim 2, wherein the movable contact bracket comprises grooves spaced apart from each other, each groove is provided with one contact spring and one movable contact, the movable contact has an end beyond the groove, and an orthographic projection that the entire end beyond the groove has on the movable contact bracket is in a region where the groove is located.

17. The method according to claim 2, wherein the detector comprises a displacement sensor.

* * * * *